United States Patent
Zurutuza Elorza et al.

(10) Patent No.: US 10,192,736 B2
(45) Date of Patent: Jan. 29, 2019

(54) METHOD FOR TRANSFERRING GRAPHENE BY ATTACHING REMOVABLE FRAME TO PROTECTIVE LAYER APPLIED ON A SAMPLE CONTAINING GRAPHENE MONOLAYER

(71) Applicant: GRAPHENEA S.A., Donostia, San Sebastián (ES)

(72) Inventors: M. Amaia Zurutuza Elorza, San Sebastián (ES); M. Alba Centeno Perez, San Sebastián (ES)

(73) Assignee: GRAPHENEA S.A., Donostia, San Sebastian (ES)

( * ) Notice: Subject to any disclaimer, the term of this patent is extended or adjusted under 35 U.S.C. 154(b) by 0 days.

(21) Appl. No.: 15/220,234

(22) Filed: Jul. 26, 2016

(65) Prior Publication Data

US 2017/0057812 A1 Mar. 2, 2017

(30) Foreign Application Priority Data

Aug. 24, 2015 (EP) ..................................... 15382430

(51) Int. Cl.
*H01L 21/02* (2006.01)
*B32B 37/00* (2006.01)
(Continued)

(52) U.S. Cl.
CPC ...... *H01L 21/02527* (2013.01); *B32B 37/025* (2013.01); *B32B 38/0036* (2013.01);
(Continued)

(58) Field of Classification Search
CPC ......... H01L 21/02527; H01L 21/02664; B81C 1/00158; B81C 2201/0191;
(Continued)

(56) References Cited

U.S. PATENT DOCUMENTS

2012/0244358 A1* 9/2012 Lock ................... C01B 31/0453
428/412
2013/0210218 A1* 8/2013 Accardi ............ H01L 21/02527
438/478
(Continued)

OTHER PUBLICATIONS

Suk et al. in "Transfer of CVD-Grown Monolayer Graphene onto Arbitrary Substrates," Aug. 27, 2011, American Chemical Society, ACS Nano, vol. 5, No. 9, pp. 6916-6924.*
(Continued)

*Primary Examiner* — Michael Jung

(57) ABSTRACT

A method of transferring graphene onto a target substrate having cavities and/or holes or onto a substrate having at least one water soluble layer is disclosed. It comprises the steps of: applying a protective layer (4) onto a sample comprising a stack (20) formed by a graphene monolayer (2) grown on a metal foil or on a metal thin film on a silicon substrate (1); attaching to said protective layer (4) a frame (5) comprising at least one outer border and at least one inner border, said frame (5) comprising a substrate and a thermal release adhesive polymer layer, the frame (5) providing integrity and allowing the handling of said sample; removing or detaching said metal foil or metal thin film on a silicon substrate (1); once the metal foil or metal thin film on a silicon substrate (1) has been removed or detached, drying the sample; depositing the sample onto a substrate (7); removing said frame (5) by cutting through said protective layer (4) at said at least one inner border of the frame (5) or by thermal release.

13 Claims, 7 Drawing Sheets

(51) Int. Cl.
  *B32B 38/00* (2006.01)
  *B32B 38/10* (2006.01)
  *B81C 1/00* (2006.01)
  *C01B 32/194* (2017.01)

(52) U.S. Cl.
  CPC .......... *B32B 38/10* (2013.01); *B81C 1/00158* (2013.01); *C01B 32/194* (2017.08); *H01L 21/02664* (2013.01); *B81C 2201/0133* (2013.01); *B81C 2201/0176* (2013.01); *B81C 2201/0191* (2013.01); *B81C 2201/053* (2013.01)

(58) Field of Classification Search
  CPC ........ B81C 2201/053; B81C 2201/056; C01B 31/0438; C01B 31/0484; B32B 37/025; B32B 38/10; B32B 38/0036
  See application file for complete search history.

(56) References Cited

U.S. PATENT DOCUMENTS

2014/0318967 A1* 10/2014 Busnaina .............. B82Y 10/00
 204/485
2014/0335681 A1* 11/2014 Lee .................. H01L 21/02527
 438/478

OTHER PUBLICATIONS

Zhang et al. in "Fracture toughness of graphene," Nature Communications, Apr. 29, 2014, Macmillan Publishers Limited, pp. 1-7.*
Liu, Ximeng, "Large-scale graphene transfer in ultra-high vacuum and design of a low temperature ultra-high vacuum scanning tunneling microscope," Sep. 16, 2014, M.S. Thesis at University of Illnois at Urbana-Champaign, Electrical & Computer Engineering, 46 pages. Retrived from World Wide Web at http://hdl.handle.net/2142/50627.*

* cited by examiner

METHOD FOR TRANSFERRING GRAPHENE BY ATTACHING REMOVABLE FRAME TO PROTECTIVE LAYER APPLIED ON A SAMPLE CONTAINING GRAPHENE MONOLAYER

TECHNICAL FIELD

The present invention relates to the field of graphene and, in particular, to methods of manipulating, transferring and/or manufacturing graphene.

STATE OF THE ART

Since its recent discovery, graphene has attracted much attention due to its properties, such as high electronic mobility, extraordinary thermal conductivity, great strength, flexibility and transparency. These properties make graphene an ideal candidate in many applications, such as in electronics, in energy, in touch screen and display technology and in sensors. Most of these applications will require a large-scale production of graphene. A conventional way of manufacturing graphene is by rearranging the carbon atoms in a Chemical Vapor Deposition (CVD) process. In fact, CVD, in combination with metal catalysts, has become the most preferred choice for large area production of monolayer graphene. However, most of the applications require graphene transferred onto different substrates. For example, European patent application EP2679540A1 discloses a method of manufacturing a graphene monolayer on insulating substrates from CVD graphene synthesis.

Graphene being a one atom thick material (one million times thinner than an A4 piece of paper) makes the handling of this material extremely challenging and difficult. In particular, graphene is expected to have excellent potential application in sensors, such as NEMs (nanoelectromechanical) or MEMs (microelectromechanical), among others. In these applications, graphene needs to be suspended on cavities or on holes. For example, United States patent application US2013/0018599-A1 discloses a graphene nanosensor comprising a suspended graphene flake. United States patent application US2013/0196463-A1 discloses a method of forming semiconductor nano-devices, such as nano-probes, using electro-mechanical membranes made of graphene. The graphene membrane is said to be formed on a separate substrate and transferred onto a planarized surface. According to this disclosure, a thin graphene film can be grown by CVD on copper foil. Then a thin film of polymethyl methacrylate (PMMA) is spun onto the graphene surface. Then the PMMA/graphene/copper stack is soaked in a copper etchant to remove copper. The PMMA/graphene film is then transferred to the target substrate by immersing the target substrate in water and placing the PMMA/graphene film on top. The PMMA can then be removed by using acetone or thermal treatment. The resulting graphene membrane will adhere to the planarized surface via Van der Waals interaction forces.

Graphene is also expected to have excellent potential application in combination with substrates having at least one water-soluble layer (such as $MoO_3$). In these applications, in which a graphene film needs to be deposited on such substrates, a wet transfer of graphene, such as the one described in US2013/0196463-A1, is discouraged because the residual water would damage the substrate, dissolving it. In addition, the final step of the transfer process, immersing the target substrate in water, would seriously damage it.

César J. Lockhart de la Rosa et al. describe in "Frame assisted $H_2O$ electrolysis induced $H_2$ bubbling transfer of large area graphene grown by chemical vapor deposition on Cu" (Applied Physics Letters 102, 022101 (2013)) a technique for transferring graphene grown by CVD on copper, based on mechanical separation of the graphene/copper by $H_2$ bubbles during $H_2O$ electrolysis. The process is as follows: First, graphene is grown by CVD on copper followed by deposition of a support PMMA thin film. Then a polyethylene terephthalate (PET) supporting frame is placed on the top of the PMMA/graphene/Cu-sandwich. The PET-frame/PMMA/graphene/Cu-bundle is submerged into an aqueous solution and subjected to electrolysis for separating the Cu foil from the graphene by the $H_2$ bubbling. The PET-frame/PMMA/graphene-bundle is then picked up and rinsed in several deionized water baths. Next it is placed on the $SiO_2$/Si target substrate and left at room temperature until it gets dry. The PET frame is then removed by cutting. The PMMA is then dissolved by acetone. Gluing PMMA to PET frame is a complicated task because there is no adhesive element included in the PET frame.

Ji Won Suk et al. describe in "Transfer of CVD-Grown Monolayer Graphene onto Arbitrary Substrates" (ACSNANO, Vol. 5, no 9, 6916-6924, 2011) a dry transfer technique for transferring graphene grown on copper foils by CVD on a substrate having shallow depressions. The process is as follows: First, graphene is grown by CVD on copper. Then a support PMMA thin film is added. Then a polydimethylsiloxane (PDMS) flexible frame is placed on top of the PMMA/graphene/Cu-sandwich by "natural" adhesion. The copper is then etched while the PDMS-frame/PMMA/graphene block is floated over an etchant solution. The composite is thus rinsed and dried after etching, thereby removing the liquid used in the etching process. Next, the PDMS-frame/PMMA/graphene composite is placed onto the target substrate, covering its wells. The substrate is heated until the wavy and rough PMMA/graphene film makes full contact with the target substrate. After heating, the adhesion of the graphene to the substrate is strong enough to peel off the PDMS frame without delaminating the PMMA/graphene film. Finally, the PMMA is thermally removed in a furnace without the use of any solvent. However, the percentage of covered holes or cavities with this process is relatively low. Besides, this process causes severe tensions in the graphene film, which may cause graphene to suffer from irreversible damage. In addition, the flexible PDMS frame used by Suk et al. tends to bend and wrinkle heavily, causing the graphene to stretch, retract and wrinkle during manipulation. At the same time the drying stage becomes very difficult due to the poor stability of the assembly. As a consequence of the poor mechanical stability of the PDMS frame, the graphene film gets seriously damaged and tends to break in many areas while other areas are full of holes. Furthermore, the heat treatment to peel off the PDMS frame does not really work due to the poor mechanical properties of the PDMS. Besides, it has been observed that a good adhesion of the frame onto the PMMA/graphene/Cu stack is very difficult to achieve without an adhesive layer. Finally, the adhesion of the PDMS-frame/PMMA/graphene stack onto the final substrate was also very difficult to achieve due to the poor drying of the remaining water after the etching step, again as a consequence of the poor mechanical stability of the frame.

DESCRIPTION OF THE INVENTION

It is therefore an object of the invention to provide a method of transferring graphene that overcomes the drawbacks of well-known methods. The new transfer method is especially useful in applications which require that large area graphene is suspended on cavities or on holes or on soluble substrates. In this text, the expression "large area graphene" refers to surfaces of up to 30 cm×30 cm approximately. However, the method is not only limited to such large areas; rather, smaller areas can also be profitably used. We refer to "area" because the thickness of graphene is so small (around 0.345 nm) that the layer of graphene is substantially flat in comparison to its two remaining dimensions. The new method allows the production of suspended graphene on cavities, as well as the transfer of graphene to water-soluble substrates, by using a supporting frame that allows drying the film before transferring it. Thus, a graphene film free of water is achieved.

According to an aspect of the present invention, there is provided a method of transferring graphene onto a target substrate having cavities and/or holes or onto a substrate having at least one water soluble layer. The method comprises the steps of: applying a protective layer onto a sample comprising a stack formed by a graphene monolayer grown on a metal foil or on a metal thin film on a silicon substrate; attaching to the protective layer a frame comprising at least one outer border and at least one inner border, the frame comprising a substrate and a thermal release adhesive polymer layer, the frame providing integrity and allowing the handling of the sample; removing or detaching the metal foil or metal thin film on a silicon substrate; once the metal foil or metal thin film on a silicon substrate has been removed or detached, drying the sample; depositing the sample onto a substrate; removing the frame by cutting through the protective layer at the at least one inner border of the frame or by thermal release.

In a particular embodiment, the substrate is a substrate having cavities or holes or it is a substrate comprising a water-soluble layer.

In a particular embodiment, the protective layer is selected from the following group: poly (methyl methacrylate) (PMMA), cellulose nitrate (NC), cellulose acetate butyrate (CAB), poly(lactic acid) (PLA), poly(phthalaldehyde) (PPA), poly(bisphenol A carbonate) (PC), as well as any combination or derivative of any of the former compounds. In a preferred embodiment, the protective layer is made of poly (methyl methacrylate) (PMMA).

In a particular embodiment, the frame has a Young's modulus equal or higher than 10 MPa, more preferably higher than 500 MPa, still more preferably between 500 MPa and 6,000 MPa, and even more preferably between 1,500 MPa and 4,000 MPa. In a particular embodiment, the frame is made of REVALPHA.

In a particular embodiment, when the frame is removed by cutting through the protective layer at the at least one inner border of the frame, the dimensions of the outer border of the frame are larger than the outer dimensions of the sample.

Preferably, after removing the metal foil or metal thin film on a silicon substrate by an etchant solution, the sample is cleaned with distilled water.

In a particular embodiment, the sample is dried using $N_2$.

In a particular embodiment, the substrate is heated prior to receiving the sample.

In a particular embodiment, after removing or detaching the frame, the sample is baked to improve adhesion.

In a particular embodiment, the protective layer is removed by means of a thermal treatment or solvents but preferably by means of thermal treatment.

In a particular embodiment, the graphene monolayer is grown on the metallic foil or on the metal thin film on a silicon substrate following a process of Chemical Vapor Deposition (CVD).

According to another aspect of the present invention, suspended graphene or deposited graphene is obtained by the method previously described.

According to another aspect of the present invention a device comprising suspended graphene or deposited graphene obtained by the method previously described, the device being preferably a NEMs or MENs sensor.

Additional advantages and features of the invention will become apparent from the detailed description that follows and will be particularly pointed out in the appended claims.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The drawings comprise the following figures:

FIG. 1A shows a metal foil, on both sides of which graphene has grown. An adhesive polymer is applied in order to remove one of the graphene layers. FIG. 1B shows a graphene monolayer/metal foil, after detaching the adhesive polymer and the bottom graphene layer.

FIG. 2 shows a frame/protective layer/graphene layer/metal foil stack. FIG. 3 shows a top view of an exemplary frame used in the process of transferring graphene of the invention. FIG. 4 shows the stage of removing the metal foil by picking up the sample and making it float into an etchant solution. FIG. 5 shows a sample formed by a frame/protective layer/graphene layer stack. FIG. 6 shows the stage of depositing the sample onto a substrate.

DESCRIPTION OF A WAY OF CARRYING OUT THE INVENTION

Figure 1A:
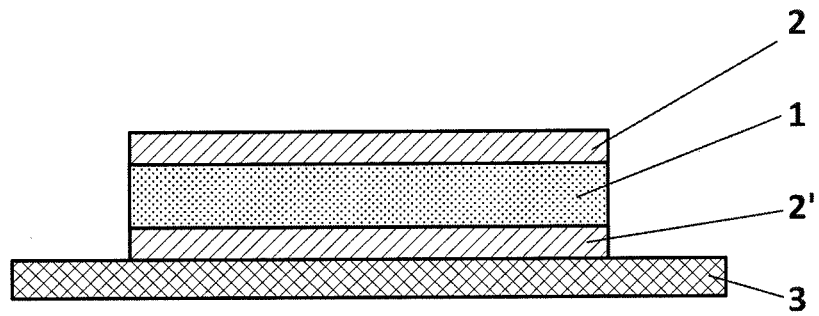
FIGS. 1A-1B illustrate a process of obtaining CVD graphene according to an embodiment of the invention.

In this text, the term "comprises" and its derivations (such as "comprising", etc.) should not be understood in an excluding sense, that is, these terms should not be interpreted as excluding the possibility that what is described and defined may include further elements, steps, etc.

In the context of the present invention, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The following description is not to be taken in a limiting sense but is given solely for the purpose of describing the broad principles of the invention. Next embodiments of the invention will be described by way of example, with reference to the above-mentioned drawings showing apparatuses and results according to the invention.

A method for transferring graphene is explained next. The method allows the transfer of large area graphene. The method is particularly interesting in applications which require that large area graphene is suspended on cavities (closed or open) or holes of substrates and in applications which require that large area graphene is deposited on water soluble substrates.

Currently, the most usual way of obtaining monolayer graphene is by CVD (Chemical Vapour Deposition). There are alternative ways of obtaining monolayer graphene, such as the micromechanical exfoliation of graphite or the sublimation of silicon carbide (SiC) substrates. However, they are not industrially scalable methods to obtain large area graphene coverage on arbitrary substrates. The micromechanical exfoliation method typically produces monolayer flakes that range from 500 nm up to a few micrometers. In turn, the graphene obtained from the sublimation of Si atoms from SiC, is extremely difficult to detach from the SiC substrate, especially large areas of graphene. CVD has emerged as the method of choice for large area production of monolayer graphene. The use of CVD in combination with copper catalysts has enabled the relatively large-scale production of monolayer graphene. In the method of the present invention, CVD graphene is preferably obtained by any conventional CVD process for obtaining graphene, and in particular, for obtaining a graphene monolayer. The CVD reaction can be undertaken using different types of CVD equipment, such as cold walled and hot walled reactors. During the deposition process, a solid, liquid or gas carbon source is inserted into the reactor chamber. At high temperatures (normally between 600 and 1100° C.) graphene is formed on the catalyst surface (normally copper catalyst). This process can be done either at atmospheric pressure or under vacuum. Plasma can be added during graphene growth if growth at lower temperatures is desired.

Figure 1B:
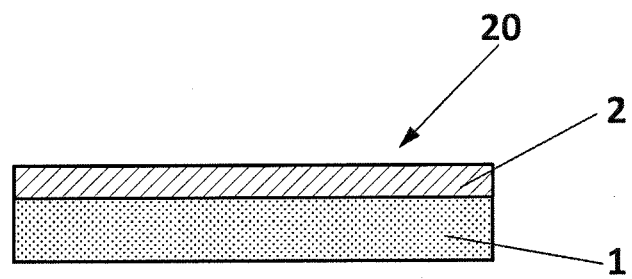

FIGS. 1A-1B illustrate an exemplary process of obtaining monolayer graphene. In particular, the illustrated process permits the obtaining of CVD graphene. Well-known alternative methods of obtaining monolayer graphene could be exemplified instead. Graphene is usually grown on top of thin metal films on silicon substrates or on metal foils. A skilled person in the art knows that thin metal films are normally thinner than metal foils. The metal can be copper. Semiconductors or insulating materials can alternatively be used to grow graphene. Among the advantages of the copper foils are their low cost, flexibility and easy handling. Graphene can be deposited on metal foils (such as copper foils) of thicknesses varying from around 10 μm up to 1000 μm. FIG. 1A shows a metal foil 1, such as a copper foil. Graphene typically grows on both sides of the foil. For this reason, one of the graphene layers is normally eliminated unless large areas of bilayer graphene are required or at least are harmless. Applying a CVD process, a first monolayer of graphene 2 is grown on the top surface of the foil 1 and a second monolayer of graphene 2' is grown on the bottom surface of the foil 1.

One of the monolayers of graphene (for example the bottom one 2') is eliminated preferably by applying a thermal release adhesive polymer tape 3 onto that graphene monolayer, as shown in FIG. 1A. This tape comprises a substrate and a thermal release adhesive polymer layer. Substrates usually comprise polymers like polyesters (polyvinyl acetate, polyethylenevinyl acetate, polyethylene terephthalate, polyethylene naphthalate, etc.), polyacrylates (polymethyl acrylate, polyethyl acrylate, polypropyl acrylate, polybutyl acrylate, etc.), polymethacrylates (polymethyl methacrylate, polyethyl methacrylate, polypropyl methacrylate, polybutyl methacrylate, polyhydroxyethyl methacrylate), polyolefins (polyethylene, polypropylene), polyimides, polyamides, polycarbonates, polyether ether ketones, polyphenylene sulfide, polyvinyl chloride, or mixtures thereof. The thermal release adhesive polymer layer usually comprises one or more polymers selected from acrylic polymers, vinyl alkyl ether polymers, PEVA, silicone rubber, rubber (butyl rubber, natural rubber), urethane polymers, styrene-diene block copolymers, nitrile polymers, fluorine based polymers and their mixtures. In addition this adhesive polymer layer can also contain additives and/or foaming agents, such as microspheres.

According to a particular embodiment, the thermal release adhesive polymer tape is REVALPHA, a commercially available adhesive tape.

The thickness of the adhesive polymer tape 3 is usually between 0.01 and 1 mm and preferably between 0.01 and 0.25 mm.

The adhesive polymer tape 3 can be applied, for example, using a pressure and speed controller roller, for example such as one speed controller roller as disclosed in EP2679540A1. The rolling means is out of the scope of the present invention. This machine enables the application of the adhesive tape on the graphene layer (for example bottom layer) instead of doing it by hand; applying controlled pressure and speed by rolling means avoids the formation of bubbles between the bottom graphene layer/metal foil and the adhesive polymer tape 3. Preferably, the applied pressure varies between 0.01 to 0.8 MPa; it is preferably applied for a time period varying between 1 to 240 seconds, depending on the dimensions of the graphene layer to be removed.

The adhesive polymer tape 3 is then detached from the metal foil 1, thus removing the bottom graphene layer 2', as shown in FIG. 1B. Such detaching process is out of the scope of the present invention. The detaching process is preferably done by applying heat, for example as follows: The sample formed by the top graphene monolayer/metal foil/bottom graphene monolayer/adhesive polymer tape is deposited on a hot plate and exposed to a temperature varying between 1 and 20° C. above the release temperature of the adhesive polymer tape 3. Such applied temperature preferably varies between 1 and 5° C. above the release temperature of the adhesive polymer tape 3. Once the adhesive polymer tape 3 and the unwanted graphene monolayer 2' have been detached, the desired graphene monolayer/metal foil stack 20 (FIG. 1B) is ready to be transferred onto a substrate, for example by using a conventional wet transfer process.

As already mentioned, the problem arises when graphene (and in particular, large area graphene) needs to be transferred onto a substrate having cavities or holes (that is to say, when graphene needs to be suspended on this substrate) or when graphene needs to be transferred onto a water soluble substrate or onto a substrate having at least one soluble layer, in which case a wet transfer process does not work. A well-known problem that arises when a conventional wet transfer process for large area CVD graphene is used, is that water is trapped in between the graphene film and the substrate. This becomes even more critical when graphene has to be suspended on cavities (or holes) and the water trapped in the cavity (or hole) collapses and breaks the film; and when the substrate has at least one water soluble layer.

FIGS. 2 to 6 show different stages of the transfer method according to an embodiment of the invention. The starting sample is the graphene monolayer/metal foil stack 20 of FIG. 1B. The metal foil 1 is preferably copper foil. The sample is coated with a sacrificial protective layer 4, which is applied on the desired (not removed) graphene layer 2. Non-limiting examples of materials to be used as protective layer 4 are: polymethyl methacrylate (PMMA), cellulose nitrate (NC), cellulose acetate butyrate (CAB), poly(lactic acid) (PLA), poly(phthalaldehyde) (PPA), poly(bisphenol A carbonate) (PC), their derivatives, as well as combinations thereof. The thickness of the protective layer 4 is preferably between 20 nm and 10 microns; and more preferably between 100 and 1000 nm. In a particular embodiment, the protective layer 4 comprises polymethyl methacrylate (PMMA). Although in the current embodiment the sacrificial protective layer 4 has been applied after eliminating the bottom layer of graphene 2', in an alternative embodiment the detachment of such graphene layer 2' using an adhesive polymer tape 3 can be done after applying the sacrificial protective layer 4 on the wanted graphene layer 2.

Figure 2:
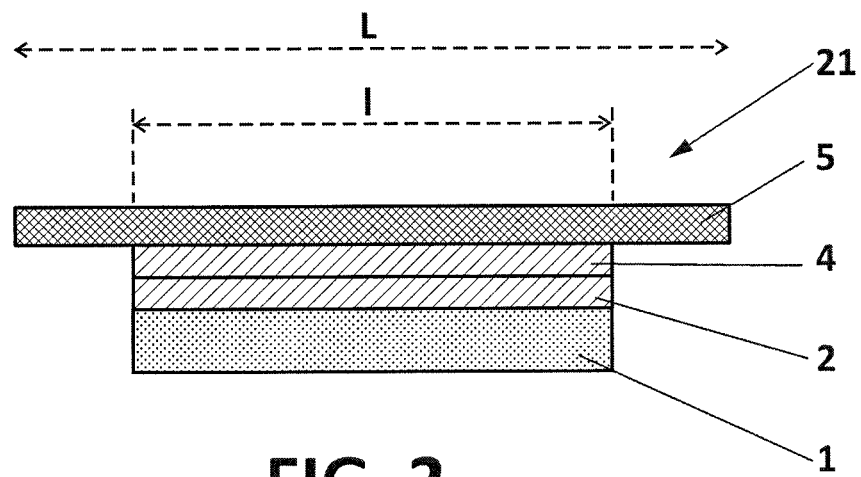
FIGS. 2 to 6 show different stages of the transfer method according to an embodiment of the invention.
Figure 3:
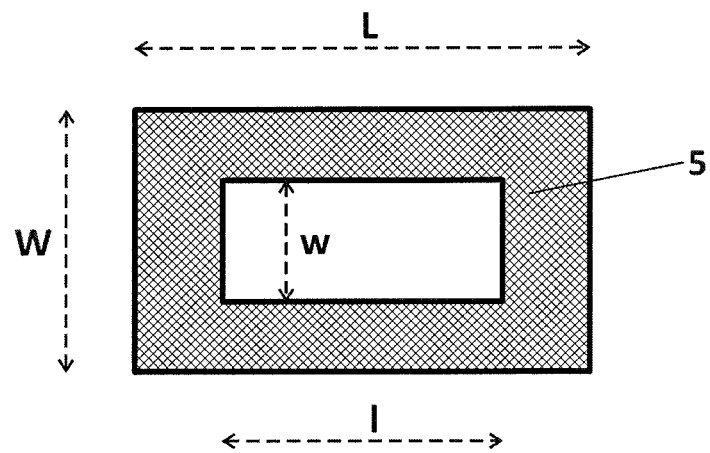

Next, a frame 5 is attached on the protective layer/graphene layer/metal foil stack. The frame 5 is an element that provides integrity and permits the handling of the sample. For example, the sample including the frame can be handled by means of tweezers or automatic equipment such as robotic arms. The frame 5 is attached on the sacrificial protective layer 4 as shown in FIG. 2. FIG. 3 shows a top view of an exemplary frame 5. The frame 5 comprises a substrate and a thermal release adhesive polymer layer. Both the substrate and the thermal release adhesive polymer layer may comprise the same polymers as above disclosed for the adhesive polymer tape 3, and the polymer layer may also comprise additives and/or foaming agents, like microspheres.

The frame 5 must have a Young's modulus equal or higher than 10 MPa and more preferably higher than 500 MPa. Still more preferably, the frame 5 has a Young's modulus between 500 MPa and 6,000 MPa; and even more preferably between 1,500 MPa and 4,000 MPa. The inventors have observed that adhesive tapes with this feature, provide the frame 5 with surprising advantages over other materials from which frames have been reported, for example by Ji Won Suk et al. (who have reported a frame made of PDMS). Unlike the low-stability and low-integrity frame chosen by Suk (Young modulus below 1 MPa), which tend to bend, causing the graphene to wrinkle during manipulation and making the drying stage difficult, the selected frame 5 is stable, rigid, easy to handle and does not generate substantial tension during the etching or metal detaching stage. In addition, unlike the frame chosen by De la Rosa et. al., the selected frame 5 is easily attached onto the graphene layer or protective layer/graphene layer surface due to the adhesive polymer layer of the frame. Inventors have observed that the frames used in prior-art transfer methods are discouraged in transfer processes involving large-area graphene.

In a particular embodiment, the frame 5 is fabricated using REVALPHA adhesive tape, which is easily glued to the protective layer/graphene layer/metal foil sample.

The frame 5 is a flat element to be attached or glued to the protective layer/graphene layer/metal foil sample, on top of the protective layer 4. The thickness of the frame 5 is preferably between 0.01 and 1 mm and more preferably between 0.01 and 0.25 mm. The frame 5 forms a flat ring of any shape. The term "ring" refers to its shape having a hollow (through hole) or "closed loop", and does not necessarily refer to a circular or oval shape. The shape of the flat ring forming the frame can be square or rectangular, as shown in FIG. 3, or a different one. Other shapes are possible, provided that they fit with the shape of the sample and in turn with the shape of the target substrate. The frame 5 is required to handle the sample. The outer dimension of the frame (outer border of the ring) is equal to or larger than the respective dimension of the sample. In the rectangular frame 5 of FIG. 3, the outer length L and width W of the frame are larger than respectively length and width of the sample on which the frame is to be attached. The inner length l and width w of the frame are substantially the same as respectively length and width of the sample. Once the sample has been transferred to the target substrate thanks to the frame 5, this must be either cut from the sample or thermally released therefrom. That is why the inner length l and width w (in general, inner dimension) of the frame are substantially the same as respectively length and width of the sample: removal of the frame is done either by cutting through the protective layer 4 at the inside borders or by heating (thermal release). The specific size and shape of the frame 5 will depend on the final substrate used (substrate to which the graphene layer is to be transferred). As a matter of an example in which the frame 5 is going to be cut from the sample, a substrate having dimensions of 1×1 $cm^2$ will require a frame having outer dimensions of around 2×2 $cm^2$ and inner dimensions of around 1.5×1.5 $cm^2$ (a bit larger than that of the substrate onto which the graphene is to be transferred). If, however, the frame is going to be thermally released, the dimensions of the frame do not need to be larger than those of the substrate. Instead, in this case the dimensions of the frame can be substantially the same as the dimensions of the substrate. This is to be considered as an example, since larger areas of graphene can be transferred thanks to the proposed method.

Figure 4:
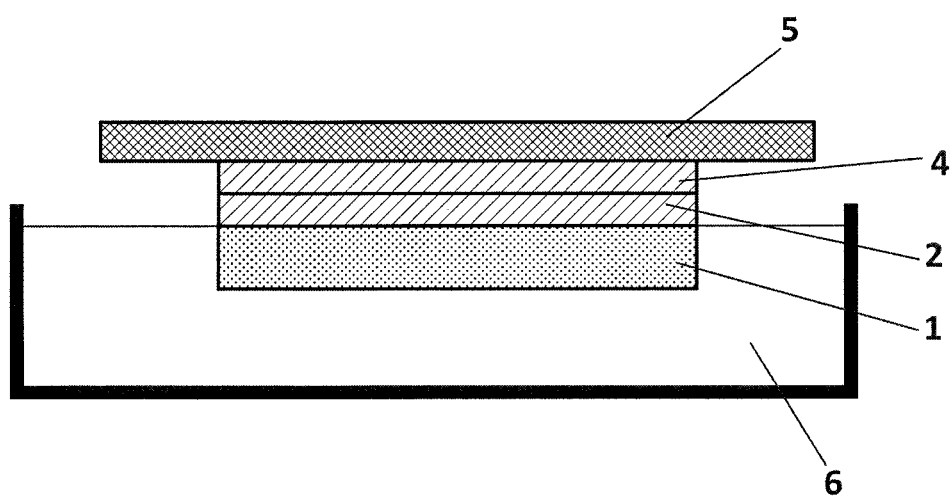
Figure 5:
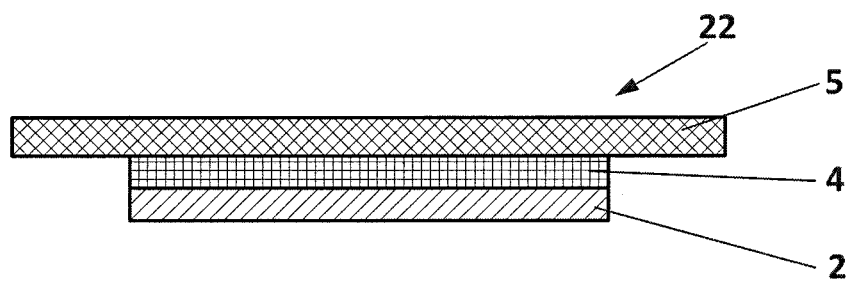

Now that the sample has enough integrity for it to be handled (for example using tweezers or robotic arms), the metal foil 1 needs to be removed from the sample 21 as shown in FIG. 2. Once the metal foil 1 has been removed, the sample can be deposited or suspended on a target substrate. In a particular embodiment, removal of the metal foil 1 is done by picking up the sample (frame/protective layer/graphene layer/metal foil stack), which can be handled thanks to the frame 5, and making it float onto an etchant solution 6. This is illustrated in FIG. 4. When the metal foil 1 is a Cu foil, the etchant solution 6 is a Cu etchant solution. The etchant solution is for example $FeCl_3$ or ammonium persulphate. This etchant solution permits to get rid of the metal foil 1. Afterwards, in order to remove etchant residues, the sample, substantially free of copper, is preferably cleaned several times with fresh distilled water. In an alternative embodiment, removal of the metal foil 1 and detachment of the frame/protective layer/graphene layer is done by $H_2$ bubbles during $H_2O$ electrolysis, as a skilled person in the art is aware of. The outcome of this stage is shown in FIG. 5, wherein a sample 22 formed by a frame/protective layer/graphene layer stack is shown.

Prior to depositing or suspending the graphene layer 2 onto the target substrate, the graphene layer needs to be dried, because if graphene is wet when it is deposited onto a substrate having cavities or holes, the graphene collapses with the water that has fallen into the cavities of the substrate; or if graphene is wet when it is deposited on a substrate having at least one water soluble layer, the water soluble layer will be dissolved or permanently damaged. So, when the graphene 2 is clean, the sample 22 is taken out of the cleaning water and the remaining water is dried. The sample 22 must be dried for a certain time: the time required for graphene becoming totally dry, while the protective layer maintains certain humidity in order to keep flexibility (if it does not maintain certain flexibility, it becomes glassy and it easily breaks when it is deposited onto a substrate). Preferably it is dried from a few seconds (2-3 seconds) up to a few minutes (around 10 minutes). It is preferably dried at room temperature or up to 100° C. It can be dried either under atmospheric pressure or vacuum, using inert atmosphere, reducing atmosphere or air. In a preferred embodiment, the sample 22 is dried using a $N_2$ gun.

Figure 6:
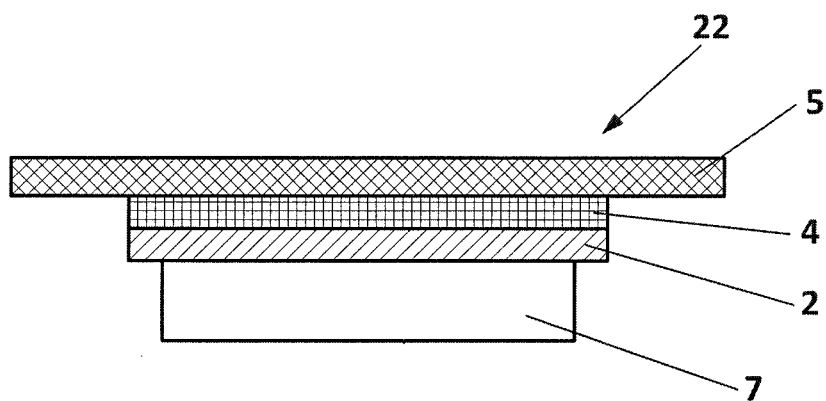

FIG. 6 shows the stage of depositing the sample 22 (frame/protective layer/graphene layer stack) onto a substrate 7. The substrate 7 is a substrate having cavities or holes, which have not been shown in the schematic drawing of FIG. 6 or a substrate having at least one water-soluble layer/material. The sample 22 can be deposited on any substrate having cavities or holes and on any water-soluble substrate. Non-limiting examples of target substrates 7 on which the sample 22 can be deposited are: 300 nm $SiO_2$/Si with cavities, metallic layer/$SiO_2$/Si with cavities (metallic layer can be Au, Pd, Pt, Ni, etc.), $Al_2O_3$, $MoO_3$/Si, $AuCl_3$/Si, or others. The target substrate 7 is preferably heated prior to receiving the sample 22. In a preferred embodiment, the sample 22 formed by frame/protective layer/graphene layer stack is dried up to 100-200° C., and also preferably, from a few seconds (2-3 seconds) up to a few hours (around 2 hours). Preferably at room temperature or up to 200° C. Preferably using atmospheric pressure or vacuum. Preferably using inert atmosphere, reducing atmosphere or air. The dried sample 22 (frame/protective layer/graphene layer) is then placed on top of the target substrate 7. Preferably the sample 22 is left on the substrate 7 at room temperature until it is dry and then put under vacuum at around 80° C.

Figure 7:
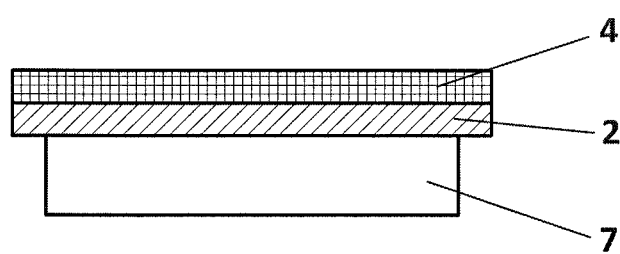
FIG. 7 shows the sample on the substrate after removal of the frame.

The sample then remains substantially adhered to the substrate 7 by means of Van der Waals interaction forces. Afterwards, the frame 5 is easily removed by cutting through the protective layer 4 at the inner borders of the frame 5 or by thermal release. Once the frame 5 has been removed (FIG. 7), the sample is baked to improve adhesion. In a preferred embodiment, the sample is baked from a few seconds (2-3 seconds) up to a few hours (around 2 hours). In a preferred embodiment, the sample is baked at a temperature varying from room temperature up to 300° C., more preferably between 170° and 250° C. Preferably using atmospheric pressure or vacuum. Preferably using inert atmosphere, reducing atmosphere or air. The protective layer 4 is then removed. This is preferably done by means of a thermal treatment, since weight applied by solvents may break the graphene layer. Alternatively, the protective layer 4 can be removed using acetone vapor. More preferably, it is removed by thermal treatment at a temperature varying between 150° and 500° C. for a time period varying between 10 mins and 4 hours, using an inert, reducing or non-oxygen containing atmosphere, such as $N_2$, Ar, $H_2$, Ar, vacuum, etc. or a combination of them.

The performance of the suspended graphene on cavities has been analyzed using non-destructive techniques, such as optical microscopy. The quality of the graphene film is analyzed using Raman spectroscopy, AFM and SEM. The suspended graphene produced using the process described in this invention has a very high quality, yield, homogeneity and uniformity, as it will be demonstrated in the following examples.

This new transfer method is especially useful in applications which require that large area graphene is suspended on cavities or on holes or deposited on soluble substrates. Next some examples are described.

EXAMPLES

Example 1. Standard Transfer Vs Frame Transfer

Monolayer graphene was transferred on substrates containing cavities with different shapes (circles, squares, bars, triangles . . . ), sizes (from 300 nm up to 100 microns) and depth (300 nm up to 2 µm). The standard wet transfer and the new transfer process proposed in this patent were compared.

Figure 8A:
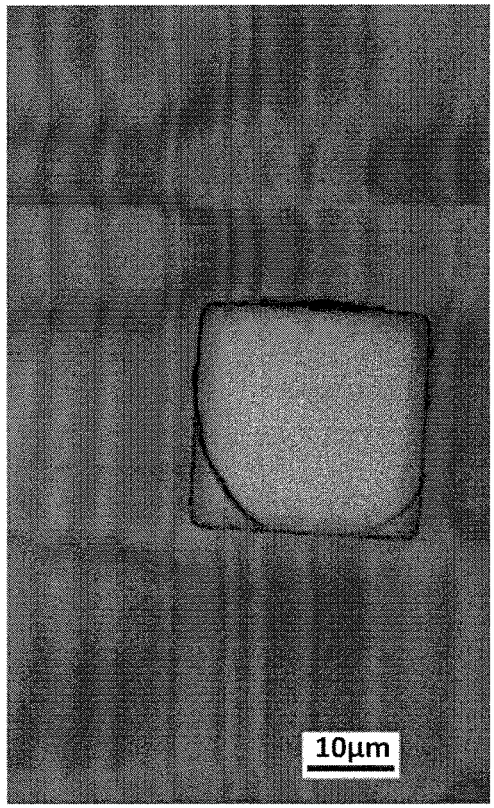
FIG. 8A shows broken monolayer graphene transferred using a conventional (STD) wet transfer method.
Figure 8B:
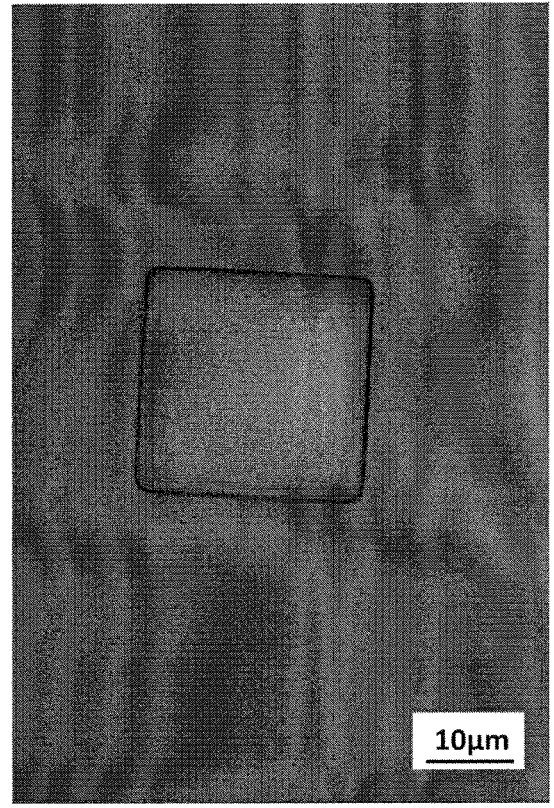
FIG. 8B shows suspended graphene obtained using the method of the present invention.

FIG. 8 shows optical micrographs corresponding to suspended monolayer graphene on 20 µm wide square cavities using the standard wet transfer method (FIG. 8A) and the proposed transfer method (FIG. 8B). While in FIG. 8A the graphene film is broken, FIG. 8B shows a successfully suspended monolayer graphene.

When the monolayer graphene is transferred using the standard wet transfer the film is collapsed and in most of the cavities the film is broken as shown in FIG. 8A. The percentage of suspended graphene on cavities is up to 15% and just the smaller cavity sizes are really suspended (300 nm). With the alternative transfer process proposed in the current invention (FIG. 8B), a much higher percentage of the cavities are covered, the coverage reaching up to 90% depending on the size of the cavities (Table 1). With the new transfer process it is possible to suspend graphene on cavities with sizes >30 µm and still obtain a relatively good cavity coverage. For smaller cavity sizes <10 µm the graphene coverage over the cavities is much higher.

TABLE 1

Suspended graphene percent coverage by standard wet transfer vs new transfer process

| | | Percent coverage (%) | |
|---|---|---|---|
| Transfer | Cavity Size | Circle | Square |
| Standard wet transfer | 300 nm | 15 | 15 |
| | 2 µm | 2 | 1 |
| | 10 µm | 0 | 0 |
| | 30 µm | 0 | 0 |
| | 100 µm | 0 | 0 |
| New transfer | 300 nm | 98 | 95 |
| | 2 µm | 95 | 90 |
| | 10 µm | 70 | 65 |
| | 30 µm | 40 | 30 |
| | 100 µm | 6 | 2 |

Example 2. Transfer Comparison Using PDMS Vs Revalpha Frames

Figure 9B:
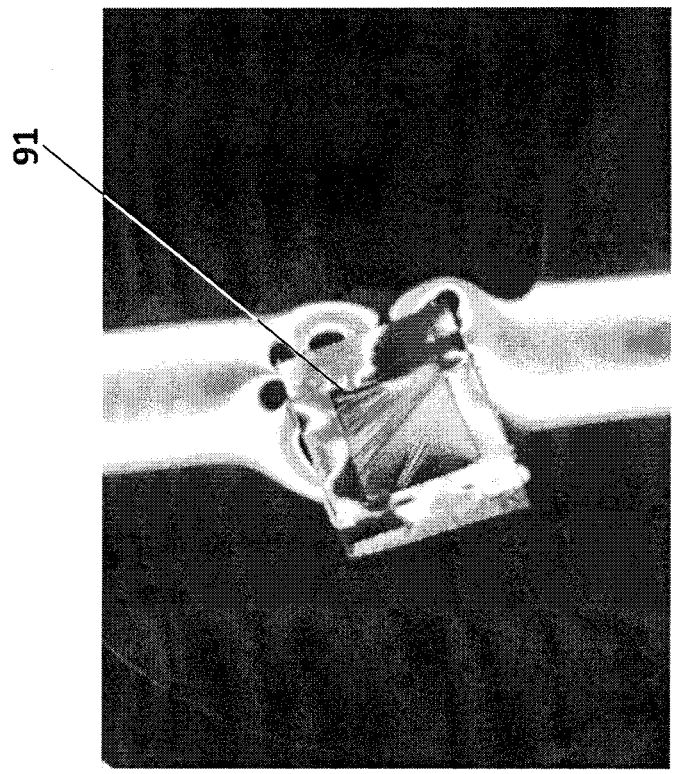
FIGS. 9A-9B show the Revalpha frame/PMMA/G (FIG. 9A) versus the PDMS-frame/PMMA/G (FIG. 9B) during Cu etching.
Figure 9A:
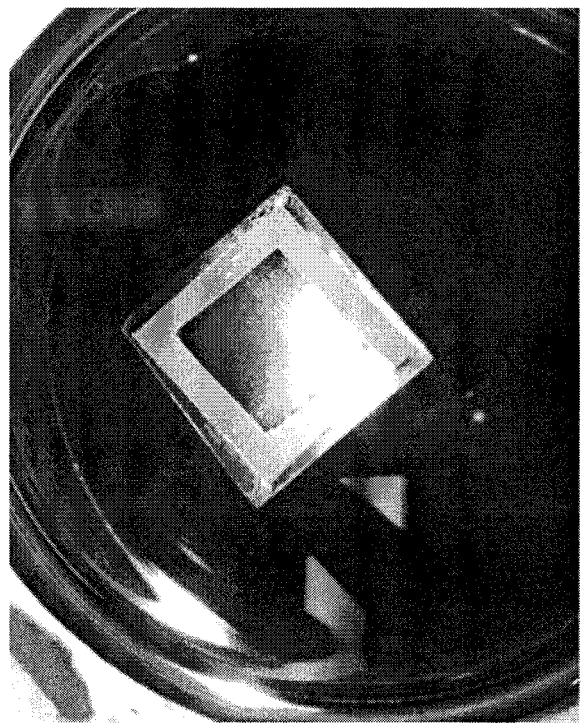

PDMS and Revalpha were used as the frame materials in order to compare and highlight the importance of the polymer properties that is used as the frame material for the graphene transfer. FIGS. 9A and 9B show visible differences during Cu etching step between both frames (Revalpha frame/PMMA/G in FIG. 9A and PDMS/PMMA/G in FIG. 9B) during Cu etching.

It can be clearly observed that when using PDMS as a frame, the PMMA/G layer contains more wrinkles 91 than when using the Revalpha. This introduces higher amount of tensions in the film and affects the flatness of the graphene. As a consequence the defects induced in the graphene layer are much higher. The poor mechanical properties of the PDMS are responsible for this behavior. PDMS has a very low Young's modulus 0.36-0.87 MPa while Revalpha has a Young's modulus between 2,700-4,000 MPa.

In addition, the drying of the film with $N_2$ gun was much more difficult when using the PDMS due a low rigidity and Young's modulus. As a consequence, a high percentage of the PDMS/PMMA/G structures had to be discarded due to the breaking of the PMMA/G film impacting negatively on the process yield. While in the case of the Revalpha frame the drying of the film did not involve any difficulties and the yield was not affected.

Figure 10A:
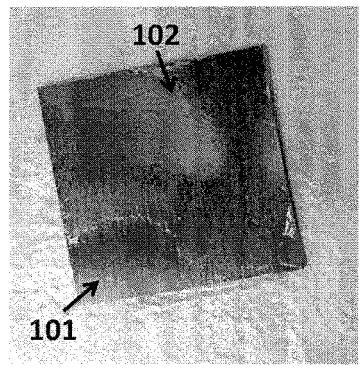
FIGS. 10A-10D show PDMS-frame/PMMA/G/300 nmSiO$_2$/Si substrate (FIG. 10A), optical micrograph showing holes (FIG. 10B), Solvents residues (FIG. 10C) and Monolayer graphene rolled up at the edges of the substrate (FIG. 10D).
Figure 10B:
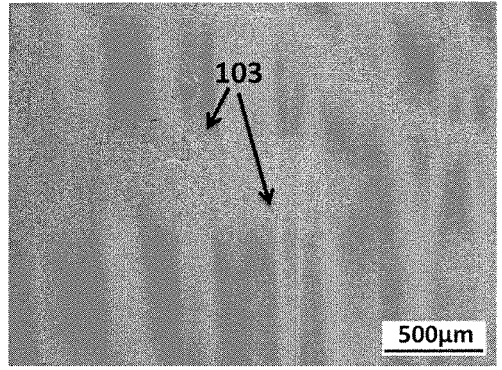
Figure 10C:
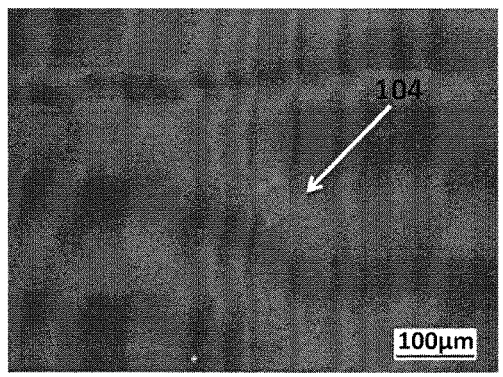
Figure 10D:
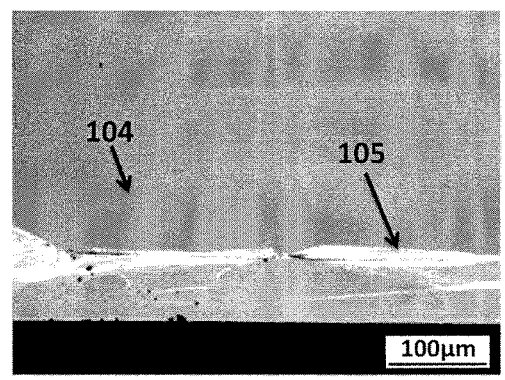

Due to the problems when drying the PDMS/PMMA/G structure, it is very difficult to attach it on top of the desired substrate (300 nm $SiO_2$/Si) (standard substrate without cavities or holes), the attachment to the substrate was significantly worse than in the case of Revalpha frame, leaving more water trapped in between the graphene layer and the substrate and non homogeneous attachment. In FIG. 10A the non-homogeneous attachment 102 of the PMMA/G film to the substrate can be observed (versus good attachment 101). When the PMMA/G/substrate was heated to 150° C. for a few minutes—and not 180° C. for 3 hours as suggested by Suk at al.—, the graphene film had many holes 103 due to the strong evaporation of water molecules (FIG. 10B). The water could not be dried properly due to the poor mechanical properties of the frame and as a consequence there was water trapped in between the graphene and the substrate. In addition, due to also the bad attachment to the substrate, when solvents were used to remove the PMMA, many solvents residues 104 were observed due to the solvent penetration between the graphene and the substrate (FIG. 10C) and the graphene tended to curl up 105 at the edges of the substrate (FIG. 10D). In the case of the Revalpha frame these issues were not observed thanks to easily handling of the film and effective drying.

Example 3. Transfer onto Water Soluble Substrates

Figure 11A:
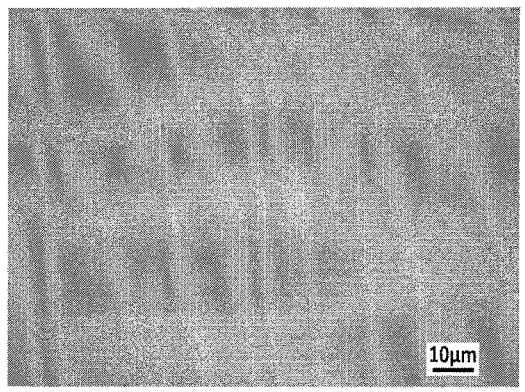
FIGS. 11A-11C show a G/MoO$_3$/G/300 nmSiO$_2$/Si sandwich structure prepared with Revalpha frame (FIG. 11A), standard wet transfer just after dipping substrate in water (FIG. 11B) and with PDMS frame (FIG. 11C).
Figure 11B:
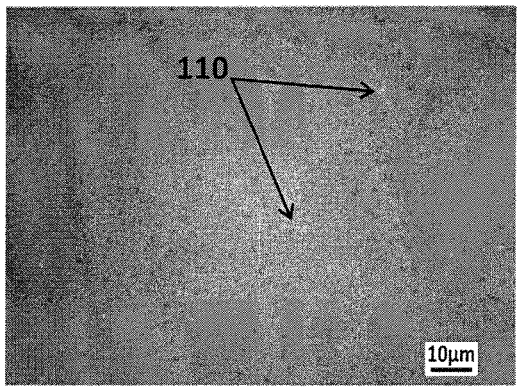
Figure 11C:
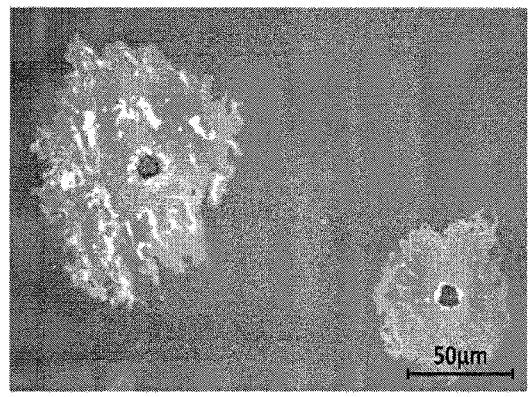

The standard wet transfer process (such as the one disclosed in Patent US20140001152 A1) is not possible when the graphene needs to be transferred onto water soluble substrates due to the need to immerse the substrate into water and as a consequence the water sensitive layer gets degraded. One example is $MoO_3$ (molybdenum (IV) oxide) which is water soluble. When sandwich structures such as G/$MoO_3$/G/300 nm$SiO_2$/Si, are required, the standard wet transfer resulted in $MoO_3$ degradation 110 after its immersion in water as shown in FIG. 11B while the proposed transfer solves this issue as shown in FIG. 11A. FIG. 11C shows the results obtained after using the PDMS frame transfer process. It can be observed that the non-optimum drying of the film when using the PDMS frame resulted in areas that were clearly damaged while in the case of the Revalpha frame no defects where observed in the $MoO_3$.

This method is scalable to transferring large CVD graphene films. Furthermore, this method can be easily integrated in an in-line, continuous or batch production process. The method thus opens up the opportunity to market graphene-based products.

The present invention also refers to the suspended graphene obtainable by the described method. This suspended graphene can be used in the manufacturing of semiconductor nano-devices or micro-devices, such as nano-probes, nano-sensors, micro-probes or micro-sensors, using nano-electro-mechanical membranes or micro-electro-mechanical membranes made of graphene. The present invention also refers to the deposited graphene on water-soluble substrates obtainable by the described method. These water soluble layers can dope the graphene and as a consequence produce a graphene material that is flexible, highly conductive and highly transparent characteristics needed for touch screen and display, lighting and solar cell applications.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

Research leading to these results has received funding from the European Union Seventh Framework Programme under grant agreement no 604391 Graphene Flagship.

The invention claimed is:

1. A method of transferring graphene onto a target substrate, said target substrate being either a substrate having cavities and/or holes or a substrate having at least one water soluble layer, characterized in that it comprises the steps of:
    applying a protective layer (4) onto a sample comprising a stack (20) formed by a graphene monolayer (2) grown on a metal foil or on a metal thin film on a silicon substrate (1);
    attaching to said protective layer (4) a frame (5) comprising at least one outer border and at least one inner border, said frame (5) comprising a substrate and a thermal release adhesive polymer layer, the thermal release adhesive polymer layer being made of a material different from the material of the substrate, the frame (5) having a Young's modulus equal or higher than 10 MPa providing integrity and allowing the handling of said sample, the frame (5) being thermally released at a temperature up to 150° C.;
    removing or detaching said metal foil or metal thin film from the silicon substrate (1);
    once the metal foil or metal thin film on the silicon substrate (1) has been removed or detached, drying the sample;
    depositing the sample onto the target substrate (7); and
    removing said frame (5) by cutting through said protective layer (4) at said at least one inner border of the frame (5), or by thermal release at a temperature up to 150° C.

2. The method of claim 1, wherein said target substrate (7) is a substrate having cavities or holes or it is a substrate comprising a water-soluble layer.

3. The method of claim 1, wherein said protective layer (4) is selected from the following group: poly (methyl methacrylate) (PMMA), cellulose nitrate (NC), cellulose acetate butyrate (CAB), poly(lactic acid) (PLA), poly(phthalaldehyde) (PPA), poly(bisphenol A carbonate) (PC), as well as any combustion or derivative of any of the former compounds.

4. The method of claim 3, wherein said protective layer (4) is made of poly (methyl methacrylate) (PMMA).

5. The method of claim 1, wherein said frame (5) has a Young's modulus higher than 10 MPa.

6. The method of claim 5, wherein said frame (5) is made of adhesive tape.

7. The method of claim 1, wherein when said frame (5) is removed by cutting through said protective layer (4) at said at least one inner border of the frame (5), the dimensions of the outer border of said frame (5) being equal to or larger than the outer dimensions of the sample.

8. The method of claim 1, wherein after removing said metal foil or metal thin film from said silicon substrate (1) by an etchant solution (6), the sample is cleaned with distilled water.

9. The method of claim 1, wherein the sample (22) is dried using $N_2$.

10. The method of claim 1, wherein the target substrate (7) is heated prior to receiving the sample (22).

11. The method of claim 1, wherein after removing or detaching said frame (5), the sample is baked to improve adhesion.

12. The method of claim 1, further comprising removing said protective layer (4) by means of a thermal treatment or by means of acetone vapor.

13. The method of claim 1, wherein said graphene monolayer (2) is grown on said metal foil or on said metal thin film on a silicon substrate (1) following a process of Chemical Vapor Deposition (CVD).

* * * * *